(12) United States Patent
Sogard

(10) Patent No.: US 6,734,117 B2
(45) Date of Patent: May 11, 2004

(54) PERIODIC CLAMPING METHOD AND APPARATUS TO REDUCE THERMAL STRESS IN A WAFER

(75) Inventor: Michael Sogard, Menlo Park, CA (US)

(73) Assignee: Nikon Corporation, Tokyo (JP)

(*) Notice: Subject to any disclaimer, the term of this patent is extended or adjusted under 35 U.S.C. 154(b) by 0 days.

(21) Appl. No.: 10/098,896

(22) Filed: Mar. 12, 2002

(65) Prior Publication Data

US 2003/0176079 A1 Sep. 18, 2003

(51) Int. Cl.[7] .......................... H01L 21/26; H01L 21/42
(52) U.S. Cl. ............................ 438/795; 438/FOR 439; 361/234
(58) Field of Search ................ 250/492.2, 492.21, 250/492.22, 492.3; 219/659; 430/311, 296; 269/21; 361/234, 324; 438/FOR 439, 795

(56) References Cited

U.S. PATENT DOCUMENTS

| | | | | |
|---|---|---|---|---|
| 4,733,091 A | * | 3/1988 | Robinson et al. | 250/492.2 |
| 5,822,172 A | * | 10/1998 | White | 361/234 |
| 6,141,203 A | * | 10/2000 | Sherman | 361/234 |

OTHER PUBLICATIONS

M. Nakasuji et al., "Low voltage and high speed operating electrostatic wafer chuck using sputtered tantalum oxide membrane," Journal of Vacuum Science and Technology vol. A12(5), pp. 2834–2839(1994).

* cited by examiner

Primary Examiner—Erik J. Kielin
(74) Attorney, Agent, or Firm—Leland Wiesner

(57) ABSTRACT

A method and system for reducing displacements of a semiconductor wafer caused by thermal stresses during a fabrication process includes clamping the wafer to the multiple segments of a segmented chuck wherein the segmented chuck is capable of selectively clamping and unclamping regions of the semiconductor wafer, exposing a region of the wafer clamped to a segment of the chuck to an energy source during the fabrication process that causes thermal stress in the clamped region, unclamping the exposed region of the semiconductor wafer from the corresponding segment of the segmented chuck, and reclamping the exposed region of the semiconductor wafer to the segmented chuck as the thermal stresses of the exposed wafer region are relieved.

39 Claims, 7 Drawing Sheets

PERIODIC CLAMPING METHOD AND APPARATUS TO REDUCE THERMAL STRESS IN A WAFER

BACKGROUND OF THE INVENTION

The present invention relates to semiconductor processing and securing a wafer to a chuck during lithographic processing.

In semiconductor processing, lithographic systems transfer a pattern from a mask to a resist coated wafer by illuminating the mask with a source of radiation and projecting the resulting patterned radiation onto the resist coated wafer. In an optical system the energy source is light and in an electron beam system the energy source is a beam of electrons. To place the pattern in the right location on the wafer, the wafer must be properly positioned relative to the mask. Traditionally this is accomplished by clamping the wafer to a chuck mounted on a movable wafer stage and aligning the mask and wafer using an alignment system which measures alignment marks on the two substrates and then moves one of them, typically the wafer, until the alignment marks have the correct relative locations. In other lithography systems a mask is not used; instead a small shaped beam of radiation is used to sequentially pattern the wafer.

In conventional lithography systems, the alignment procedure is carried out once prior to starting the lithographic process. Lithographic systems use this initial alignment throughout the lithographic process under the assumption that no phenomena during the lithographic process could cause a significant misalignment impacting the yield. This saves time and increases throughput as subsequent realignments would reduce the time available for exposing wafers.

The energy projected into the wafer also heats it. The amount of heat introduced may grow in the future as new lithography technologies are introduced and as larger wafers come into use. One example of a new lithography technology that may increase wafer heating is electron beam projection lithography. In electron beam projection lithography only a fraction of the electron energy is absorbed by the resist and the rest of the energy is absorbed in the wafer. Because these semiconductor wafers have positive thermal expansion coefficients, the wafers will try to expand as the energy is absorbed. Wafers are typically attached to a wafer chuck to constrain or limit this expansion. Accordingly, the wafer's dimensions and location will change little if the chuck's dimensions do not change during the exposure. This assumes, however, that either the chuck's thermal expansion coefficient is small, or heat from the wafer is conducted efficiently out of the chuck by means of a heat transfer system. It further assumes that the wafer or parts of the wafer do not slip on the chuck.

However, slippage will occur if the thermal stresses building up in the heated wafer overcome the forces holding the wafer in place on the chuck. If parts of the wafer that have not yet been exposed slip on the chuck, these parts will no longer be aligned properly with respect to the mask or the lithography tool, and misalignment will occur, leading in general to reduced process yield.

In some cases, increasing the clamping strength of the wafer to the chuck can overcome the slippage and misalignment problems associated with the increased thermal stress. For example, vacuum chucks used in conventional optical lithography appear to clamp a wafer well-enough to avoid slippage and misalignment caused by thermal stress. Unfortunately, this solution may not continue to work as the wafer size increases and optical lithography techniques heat the wafers to higher temperatures. Eventually, the increased thermal stress caused during even optical lithography may overcome the vacuum chuck's ability to clamp the wafer.

In the case of charged particle or electron beam projection lithography (EBPL) and extreme ultraviolet lithography (EUV), clamping the wafer securely to the chuck is even more of a problem. Because EBPL and EUV expose the wafer in a vacuum or near vacuum, the preferred chuck is an electrostatic chuck. These chucks typically do not achieve as high a holding force as vacuum chucks and thermal stress accompanied by misalignment is a much more serious issue. During the exposure, the wafer heats up in exposed regions creating thermal stress. If the thermal stresses exceed the local clamping force of the chuck, portions of the wafer break away from the chuck momentarily and slip along the surface of the chuck before reattaching. The subsequent lithographic patterns will be misaligned if the thermal stress and slipping extend to the unexposed regions of the wafer.

SUMMARY OF THE INVENTION

In one aspect of the invention, a method of reducing the movement of a semiconductor wafer during fabrication includes operating to selectively clamp and unclamp the wafer to the multiple segments of a segmented chuck, exposing a region of the wafer clamped to a segment of the chuck to an energy source during the fabrication process that causes thermal stresses in the exposed segment, unclamping the exposed region of the wafer from the corresponding segment of the chuck to relieve the thermal stresses, and reclamping the exposed region of the semiconductor wafer to the segmented chuck as the thermal stresses are relieved.

In yet another aspect of the invention, a method of reducing the movement of a semiconductor wafer fabricated using a charged particle energy source includes clamping the wafer to the multiple segments of a segmented electrostatic chuck wherein each region of the semiconductor wafer overlying a segment of the chuck includes at least one die or chip site, and operating the segmented chuck to selectively clamp and unclamp one or more individual regions of the wafer, exposing a region of the wafer clamped to a segment of the chuck to a charged particle energy source during the charged particle fabrication process causing thermal stress in the clamped segment, unclamping the exposed region of the wafer from the corresponding segment of the chuck to relieve the thermal stresses, and reclamping the exposed region of the wafer to the segmented chuck after the thermal stresses of the exposed region are relieved.

The details of one or more embodiments of the invention are set forth in the accompanying drawings and the description below. Other features and advantages of the invention will become apparent from the description, the drawings, and the claims.

DETAILED DESCRIPTION

The energy used in lithography to expose resist coated wafers creates thermal stresses within a wafer which can cause significant mechanical deformation if the wafer is not effectively constrained. Even if the wafer is constrained by a chuck, the stresses may be large enough to cause the wafer or parts of it to slip from the original position on the chuck making the lithographic process inaccurate. One implementation of the present invention uses a segmented chuck to relieve substantial amounts of the thermal stresses from the wafer by periodically unclamping regions of the wafer which have already been exposed from the chuck. This allows each region to both expand and contract as the region heats up and cools thereby relieving the thermal stresses. Repeating this process during lithography reduces the transfer of thermal stress and mechanical distortion to other regions of the semiconductor wafer not yet exposed. Reduced thermal stress, for example, improves an electrostatic chuck's ability to clamp the wafer effectively during electron beam projection lithography (EBPL). It also improves the clamping abilities of other types of chucks such as vacuum chucks used in more conventional optical lithography systems.

Figure 1:
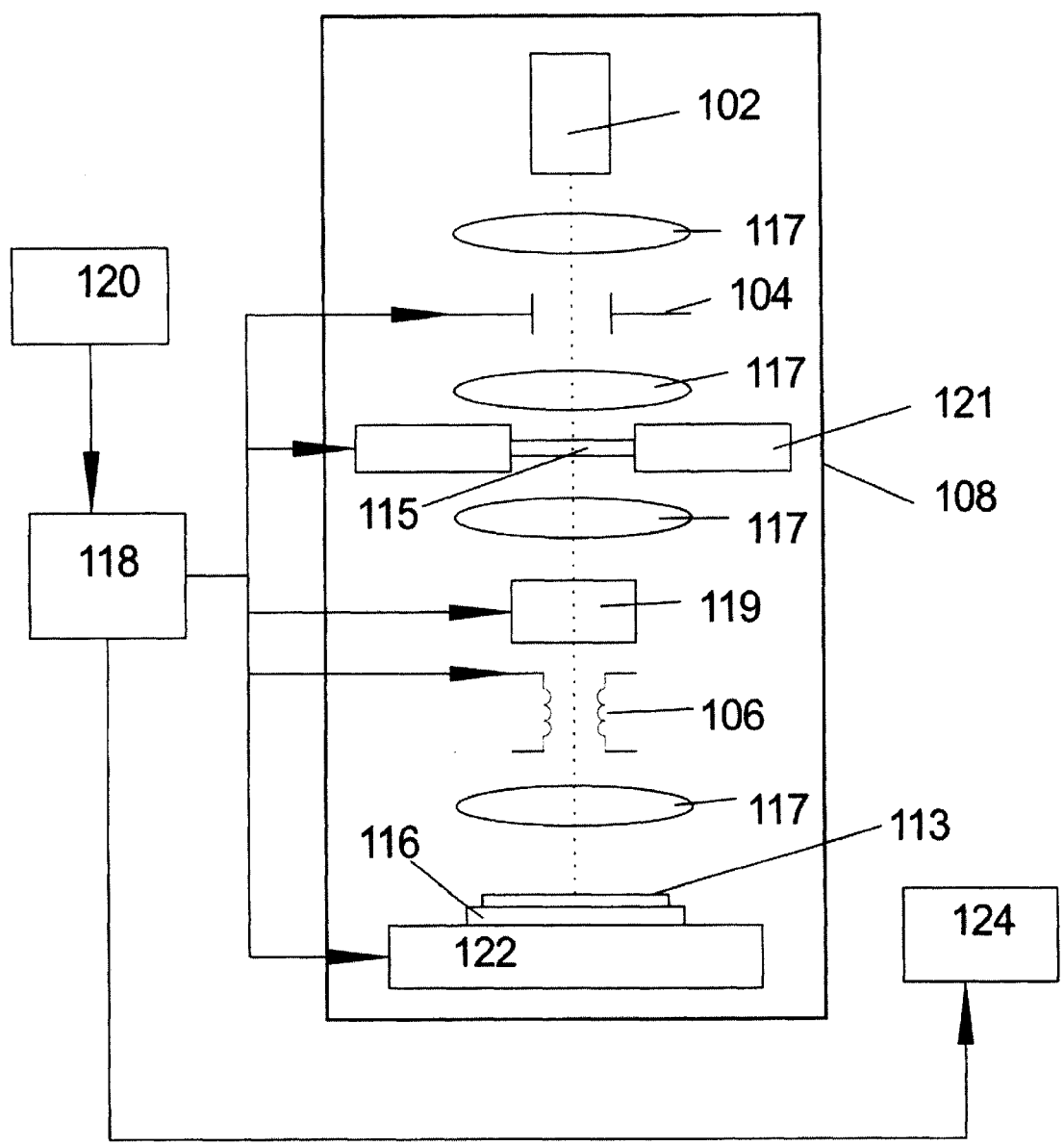
FIG. 1 is an illustration depicting an electron beam projection lithography (EBPL) system using an electrostatic chuck to clamp a wafer in position.

FIG. 1 illustrates an EBPL system 100. An electron beam generated by electron gun 102 is focused by electromagnetic lenses 117 onto reticle 115 (the "mask"). The resulting patterned electron beam is focused by additional electromagnetic lenses 117 onto an electron sensitive resist coated wafer 113. The reticle 115 is mounted on a movable reticle stage 121, and the wafer 113 is attached to movable wafer stage 122 using a segmented electrostatic chuck 116. The reticle 115 and the wafer 113 are initially aligned appropriately relative to one another and to the electron beam using an alignment system (not shown). The electron beam's position and properties are controlled by electromagnetic deflectors 106 and dynamic correction elements 119, such as focus coils and stigmators, and the beam is turned on and off by an electromagnetic blanker 104. These elements are in turn controlled by a system computer 118. System computer 118 uses information from the mask data memory 120 to determine the settings for electromagnetic deflectors 106, dynamic correction elements 119 and electromagnetic blanker 104, as well as information about the locations of the dies on the wafer. The segmented electrostatic wafer chuck is controlled by segmented chuck control 124. The electron optical elements and the stages are enclosed in a vacuum envelope 108.

Other types of electron beam lithography systems exist. For example, a single small, shaped, or variably shaped, electron beam may be used to pattern the dies on wafer 113, by sequentially writing all the patterns. Or a series of independent electron beams may write several dies simultaneously. Such systems would appear similar to that shown in FIG. 1, but there would be no reticle 115 or reticle stage 121, and initial alignment of the wafer would be done relative only to the electron beam.

Figure 2:
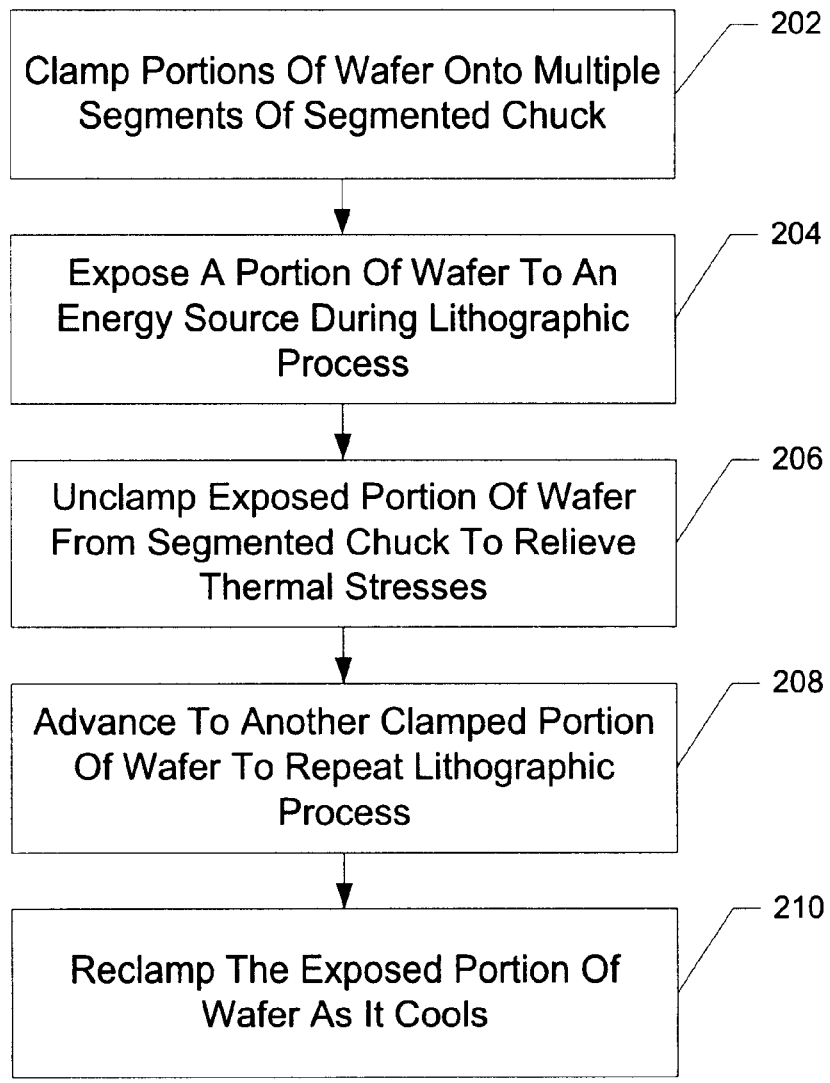
FIG. 2 is a flowchart diagram of the operations used during the lithography process to reduce slipping of a wafer clamped onto a chuck.

FIG. 2 is a flowchart diagram of the operations used during the lithography process to reduce slipping of a wafer clamped onto a chuck. Initially, the wafer is clamped to each segment of the segmented chuck before being exposed to an energy source (202). This arrangement maintains the initial alignment of the wafer to the lithography tool. The exposure sequence of the dies on the wafer is determined according to the particular writing strategy used to expose the wafer. For example, some EB lithography systems may use a single electron beam to expose the dies in a "serpentine" like pattern while other systems use multiple electron beams to expose dies in parallel.

The wafer is exposed to the energy source during the lithographic process (204). The amount of energy in the form of heat introduced into the wafer depends on the lithographic process as well as the wafer size. The increased energy required to process larger wafers creates greater thermal stresses that can lead to slipping and misalignment if not properly addressed. As an example, an electron beam with 100 keV of energy used in EBPL system 100 in FIG. 1 is typically absorbed within 60 $\mu$m of the top surface of the wafer. Because the total wafer is approximately 750 $\mu$m thick, the thermal stresses within the top 60 $\mu$m layer are far greater than at the bottom of the wafer, leading to both vertical and horizontal forces. The vertical forces work against the chuck holding the wafer and, if strong enough, cause the wafer to "cup" and lift off the chuck in the middle of the heated region. Further, in these circumstances even a small horizontal component of the stress can locally displace the freed part of the wafer.

As the region cools and relaxes back into contact with the chuck, the wafer's displacement may partially remain, leading to local misalignment. This misalignment can result in additional transverse forces on unexposed regions of the wafer eventually causing slippage of the unexposed regions if the transverse forces exceed the frictional forces holding the wafer to the chuck. It should be noted that that slippage of the exposed regions of the wafer by itself causes no problem however.

To prevent slipping from this thermal stress, exposed regions of the wafer are unclamped from the segmented chuck as their thermal stresses build up (206). Unclamping the exposed region from the segmented chuck largely releases the thermal stress and localizes the movement, if at all, in the unclamped region. The unclamped and exposed region cups more freely during the heating and cooling without transferring significant thermal stress to nearby regions. Because the exposed region is unclamped, the vertical and transverse forces have less leverage on the unexposed regions. Unexposed regions on the wafer thereby benefit as the vertical and transverse forces are either contained and/or eliminated.

In one implementation, only one region of the wafer is released from the chuck during a particular time interval. This reduces the thermal stress in an exposed region while keeping the segmented chuck attached to the remaining regions of the wafer. Alternatively, more than one region may be released from the chuck at the same time or time interval. Unclamping multiple regions during a time interval can release thermal stress more rapidly but may increase the chance of misalignment of unexposed regions.

Properly timing the unclamping of a region from the chuck can also reduce the likelihood that the wafer will slip. For example, a wafer can be unclamped while the wafer stage is moving at a constant velocity or when the wafer is not moving and has no velocity. Careful timing of this process reduces the likelihood of a wafer slipping, as the wafer would not experience transverse forces during the unclamping. For example, the segmented chuck could be programmed to release a region during a stage turnaround or while the stage travels at constant velocity to position a new die or region of dies for exposure.

Existing electrostatic chucks capable of quickly clamping and unclamping can be configured and used with implementations of the present invention. For example Electrogrip of Pittsburgh, Pa. manufactures electrostatic chucks that clamp and unclamp in less than one second. A quantitative description of fast operating electrostatic chucks can be found in *Journal of Vacuum Science and Technology* Vol. A12, pg. 2834(1994) by M. Nakasuji et al. Fortunately, since the thermal stresses are relatively strong by assumption, it may not be necessary for the electrostatic forces in a segment to decay entirely in order to relieve much of the stress. Thus, the clamping chucks described above may be configured in accordance with the present invention to permit even faster operation than otherwise expected from the wafer release time.

Referring to FIG. 2, the segmented chuck and related components in EBPL system 100 are repositioned by the wafer stage so that the above lithographic process (208) can be applied to another region of the wafer.

Meanwhile, as a region's stresses are relieved the already exposed region is reclamped to the chuck (210). Each exposed region may be unclamped and reclamped several time during the lithographic process to accommodate mechanical stresses caused during both the heating and cooling periods. Actual timing of the clamping and unclamping requires coordination of wafer stage motions with exposure completion of the dies on the wafer overlying the chuck segment being clamped and unclamped.

Figure 3:
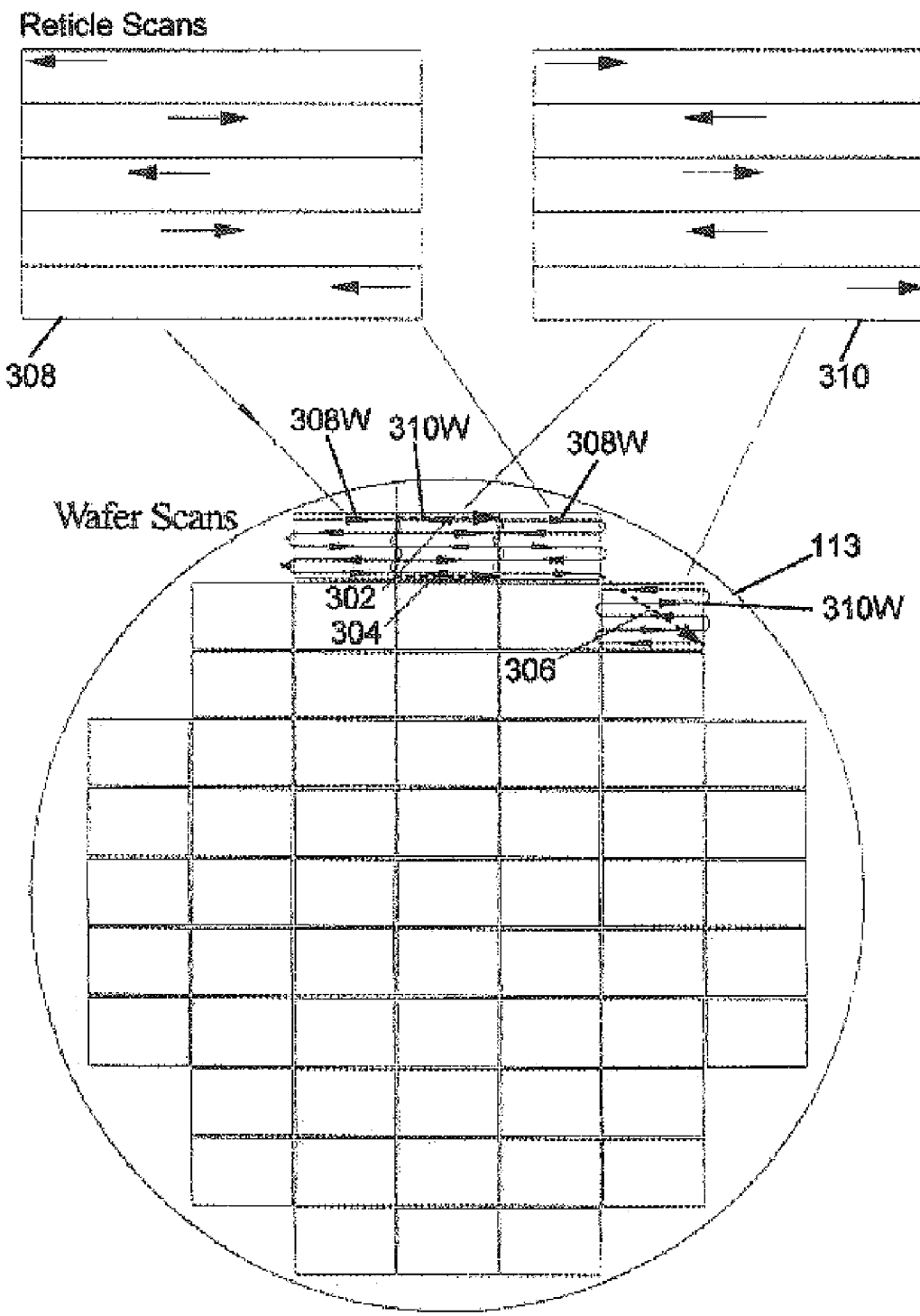
FIG. 3 is an illustration depicting a wafer with numerous dies and a serpentine scanning pattern used to expose each die to an energy source during the lithographic process.

FIG. 3 depicts wafer 113 with numerous dies and a serpentine wafer scan pattern used to expose each die by an energy source during the lithographic process. Also shown are reticle stage scan path 308 and reticle stage scan path 310 used by reticle stage 121. EBPL system 100 projects an image from different parts of reticle 115 onto a die on wafer 113. Eventually, the entire reticle patterns is transferred to the die by appropriate movements of reticle stage 121 and wafer stage 122, as well as deflections of the electron beam controlled by system computer 118 using electromagnetic deflectors 106, dynamic correction elements 119, and electromagnetic blanker 104.

Reticle stage scan path 308 is used to pattern the dies labeled 308W in FIG. 3 on the wafer while reticle stage scan path 310 is used to pattern the dies labeled 310W on the wafer. The arrows indicate the directions of the stage motions. When a die is completely exposed to the electron beam through reticle 115, wafer stage 122 steps to the next die position and the scanning and exposure process is repeated. In this example, wafer stage 122 uses stage travel 302, stage travel 304, and stage travel 306 as illustrated by the stepping paths in dashed lines to move to different dies on wafer 113 relative to the lithography tool.

Figure 4:
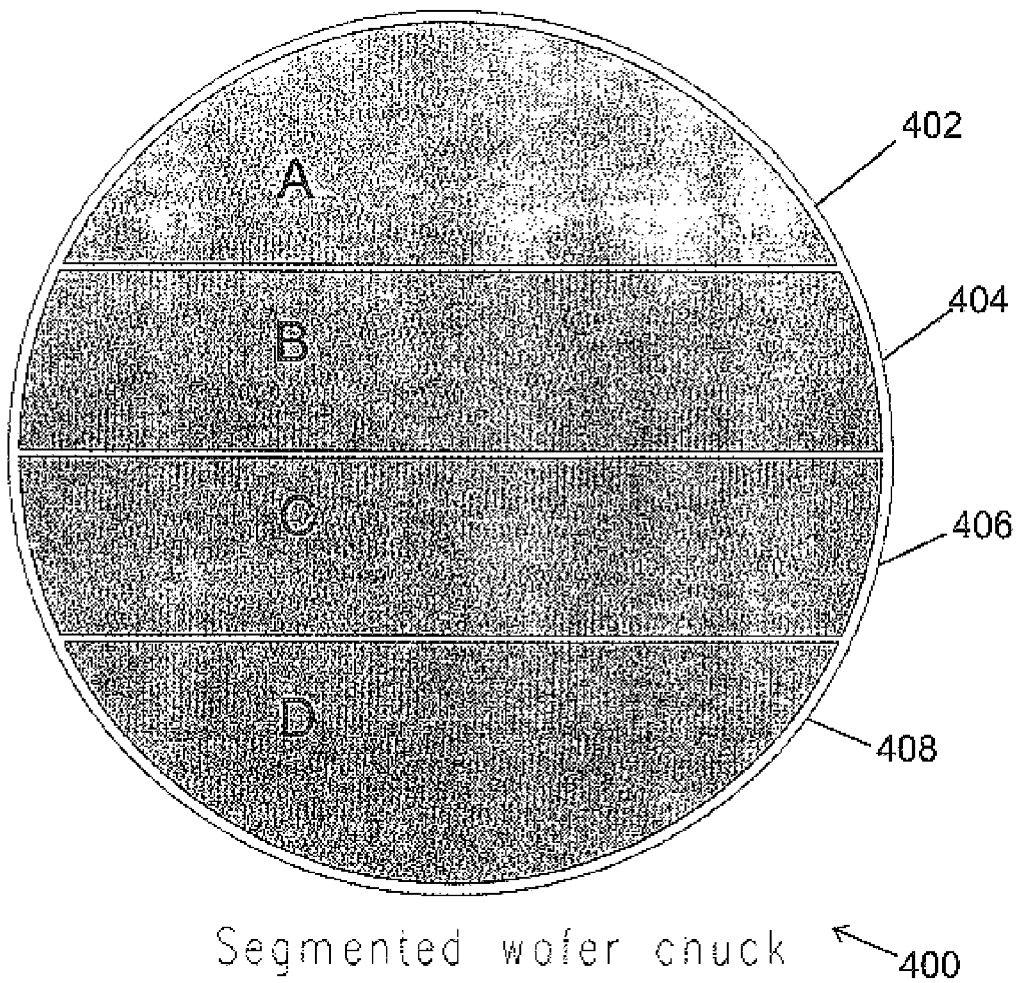
FIG. 4 is an illustration depicting a top surface of a segmented chuck used to clamp the wafer.

FIG. 4 is an illustration depicting a top surface 400 of a segmented chuck 116 with individual segments 402, 404, 406, and 408. As previously described, segmented chuck 116 in FIG. 1 clamps and unclamps wafer 113 through appropriate applications of voltage to electrostatically controlled chuck segments. By releasing the clamping force periodically from the exposed regions of the wafer, thermal stress is relieved and the unexposed regions of the wafer are less likely to slip during the lithographic process. This technique can also be used with segmented vacuum chucks that clamp the wafer by evacuating the air between the bottom of the wafer and the chuck segments. Regions of the wafer can be detached by rapidly releasing the vacuum at the appropriate chuck segments. Since the thermal stresses are relatively strong by assumption, it may not be necessary to totally release the vacuum in a segment to relieve a substantial amount of the stresses.

Figure 5:
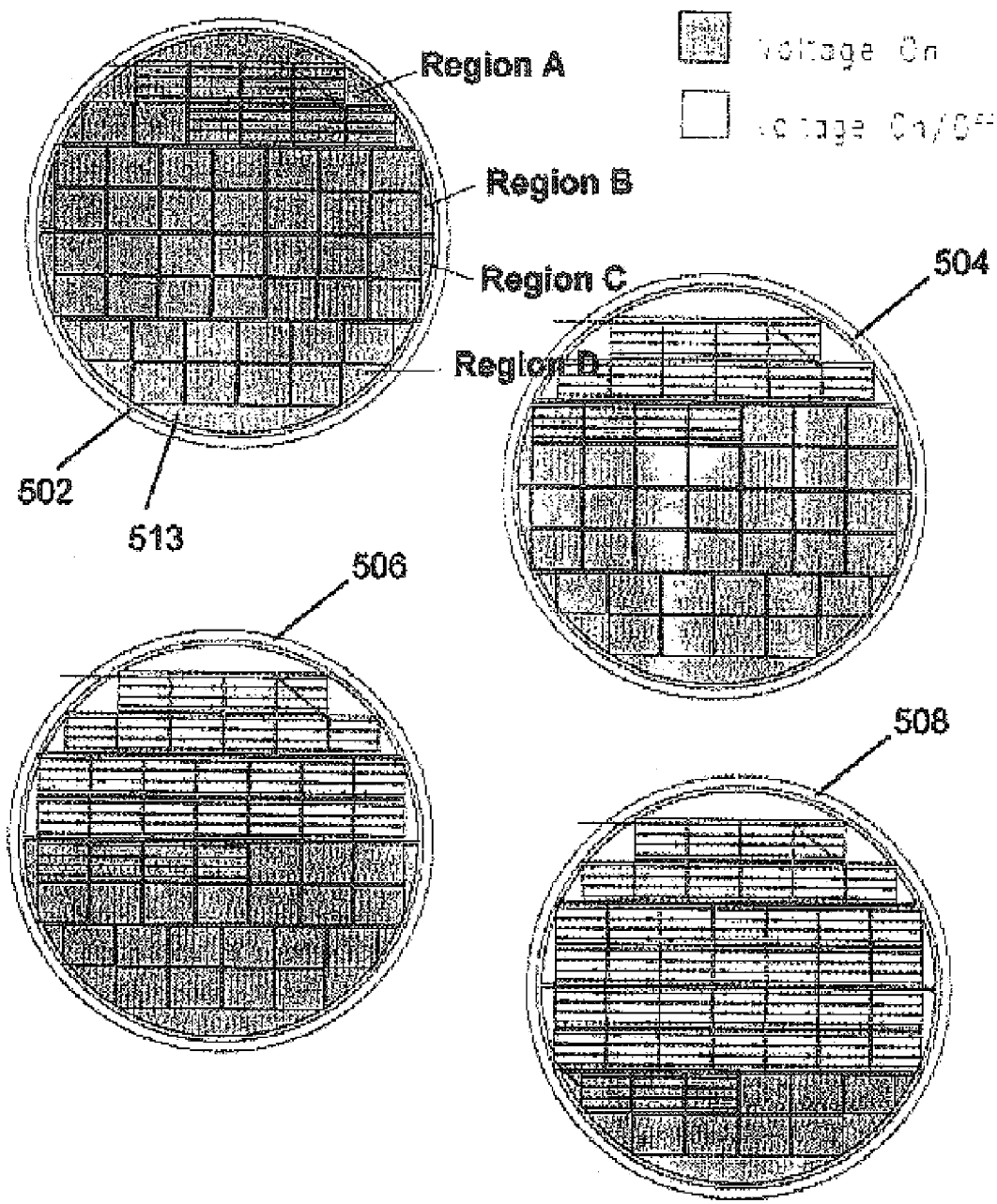
FIG. 5 illustrates several snapshots of a wafer being processed over time using EBPL and a segmented electrostatic chuck.

FIG. 5 illustrates several top-view snapshots of a wafer 513 being processed over time using EBPL and a segmented electrostatic chuck to clamp the wafer. Wafer snapshot 502 identifies the areas of the wafer positioned over the segments of the chuck as region A, region B, region C, and region D. As wafer snapshot 502 illustrates, the segments of the electrostatic chuck underlying the wafer are all initially charged/excited with voltage (i.e., Voltage On) causing the corresponding regions of the wafer to attach to the chuck. Arrows illustrate the wafer stage scan path used to expose the dies on the wafer by the energy source used in EBPL.

At the time the wafer stage scan path passes from region A to region B, most of the heat absorbed in the wafer from the energy source remains near region A and consequently most of the thermal stress also remains near region A in the wafer. The portion of the segmented chuck under region A is then de-excited as illustrated in wafer snapshot 504 thereby reducing the effect of this thermal stress in the other unexposed regions. While the segmented chuck is de-excited, it is possible that the corresponding region of the wafer may slip and lose alignment. Fortunately, because the lithographic step for the unclamped region has been completed, the region's alignment is no longer critical.

While FIG. 5 illustrates a case where each die on the wafer lies within the boundary of a single chuck segment, alternate arrangements are also possible. For example, some dies may lie within the boundaries of two or more adjacent chuck segments. To address this situation, an alternate implementation of the present invention would unclamp the two or more chuck segments once all dies overlying the several segments have been completely exposed.

As thermal stresses in region A are released, the segmented chuck under region A is excited again to re-clamp the wafer. The segmented chuck can turn-on and turn-off the voltage many times (i.e., Voltage On/Off in the legend in FIG. 5) during the lithographic process to release thermal stress as the heated wafer region first expands and then contracts as it cools.

As the wafer stage scan continues to region C as illustrated in wafer snapshot 506, region B is unclamped from the electrostatic chuck to relieve stress in a manner described above with respect to region A. Similarly, region A and B are periodically clamped and unclamped by exciting and de-exciting segments of the electrostatic chuck to further relieve thermal stresses caused by both heating and cooling.

Wafer snapshot 508 illustrates similar processing of region C after the electron beam begins processing dies on region D of the wafer. This time as region D is exposed, thermal stresses are being relieved by exciting and de-exciting segments of the segmented chuck associated with regions A, B, and C of the wafer.

In general, periodic clamping of a region begins after all dies in the particular wafer region have been exposed during the lithography process and is synchronized with times when the wafer stage is stopped or moving at constant velocity. For example, region A in wafer snapshot 504 has been exposed so the voltage in the electrostatic chuck corresponding to this region area is periodically turned-on and turned-off (i.e., Voltage On/Off). The periodic clamping is applied to region A and region B in wafer snapshot 506 after region A and region B have also been exposed. Similarly, wafer snapshot 508 further illustrates that region A, region B, and region C are subject to the periodic clamping and unclamping once they are exposed.

This clamping method works, in part, by unclamping the region of a wafer before the thermal stresses can transfer to unexposed regions of the wafer. It is important that the heat in the exposed region does not appreciably diffuse through unexposed regions of the wafer before the wafer exposure is completed. Of course, if this condition cannot be achieved, thermal stresses in an exposed region will be transferred to an unexposed region before they can be released.

Figure 6:
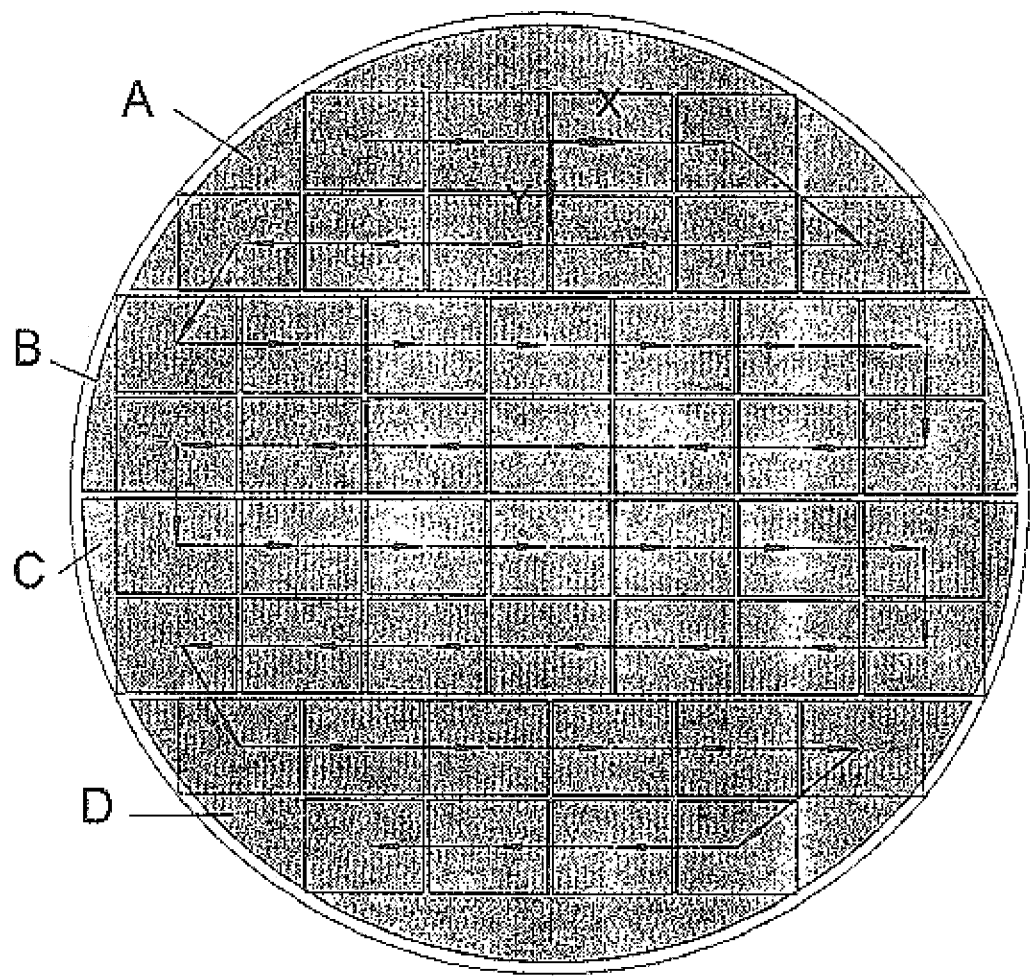
FIG. 6 illustrates the dies and diameter of a typical wafer.

Fortunately, periodic clamping in accordance with the present invention does relieve thermal stress in many semiconductor processing situations. For example, FIG. 6 illustrates a typical wafer having a diameter of 200 mm and containing approximately 48 chips each 20×25 mm$^2$. The temperature change associated with the diffusion of heat over a distance X is characterized by the expression $\exp[-X^2/\kappa t]$, where t is the time since the exposure, and $\kappa$ is the thermal diffusivity of the wafer. Assuming a value of $\kappa=90$ mm$^2$/sec. for silicon, the time required for the temperature to rise to $e^{-1}$ of its final value at a distance of X=200 mm, a wafer diameter, is approximately 450 sec. Further, the expected throughput for electron beam projection systems is to be in excess of 30 wafers/hour. Provided an overhead time of 20 sec. per wafer, the total exposure time to expose all 48 chips on the wafer is under 100 sec. and is well under the 450 sec. time period for thermal diffusion determined above. By periodically clamping the wafer in accordance with the present invention, a significant amount of heat remains localized in the exposed region and it does not have sufficient time to diffuse.

In other lithography systems where the throughput is higher, there is even less time available for a significant amount of heat to diffuse to unexposed regions of the wafer. This calculation ignores any transfer of heat to the chuck where it can be removed by a heat exchanger system. Accordingly, an alternate implementation would also use a heat exchanger system alone or in combination with aspects of the present invention described above. This additional feature would further reduce the transfer of thermal stresses to unexposed areas of the wafer.

Figure 7:
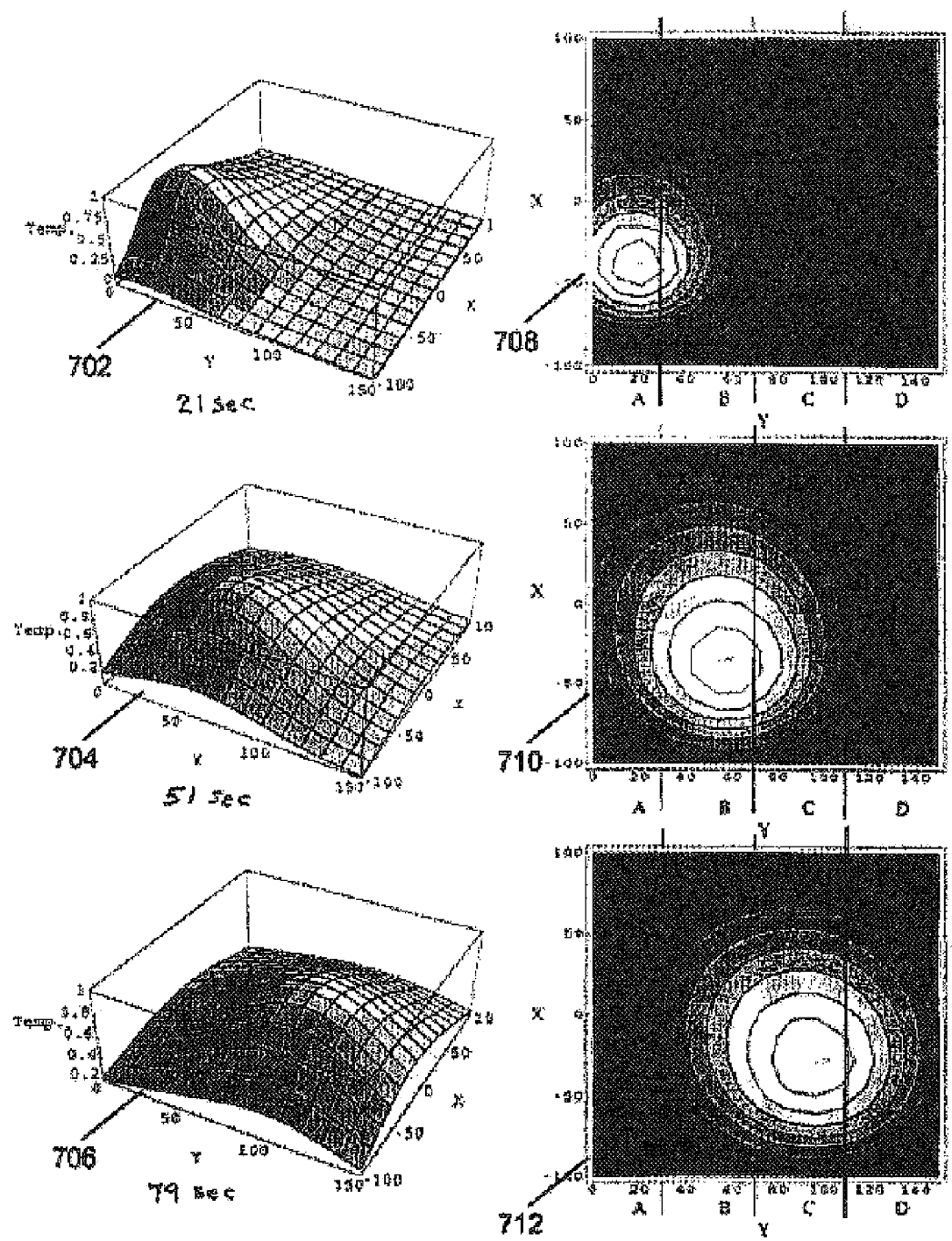
FIG. 7 illustrates temperature distributions on a wafer visually using 3D and 2D temperature graphs.

The timing of heat diffusion and related measurements is shown more quantitatively in FIG. 7 using an analytical solution to the heat equation. In this example, the analytical solution approximates a wafer as a thin plate and the exposure of each die by a deposition of energy at approximately the center of each die. In addition the wafer is assumed to be thermally insulated, so no heat can be transferred to the wafer chuck. The exposure sequence corresponds to the order shown in FIG. 6 using a 200 mm$^2$ wafer having 48 dies. Given the above throughput of 30 wafers/hour, each chip is exposed in a time of about 2 sec. Temperature calculations for the entire wafer are made shortly after each region of the wafer is exposed to the energy source and the temperature displayed is that approximately halfway through the wafer thickness. In this example, region A is exposed at the end of 21 sec., region B is exposed by 51 sec., and region C is exposed by 79 sec.

The temperature distributions, normalized to 1.0, in FIG. 7 are provided visually using 3D temperature graphs 702, 704, and 706 and 2D temperature graphs 708, 710, and 712. The contour lines in the 2D graphs represent decile changes in temperature. Collectively, these illustrations confirm that the heat remains largely in the already exposed regions and does not have time to diffuse substantially to the unexposed regions. This is true even though the temperature is calculated for some finite time period after the exposure, while the wafer stage is transitioning to another region. Because thermal stresses remain localized for a period of time, unclamping the already exposed regions from the segmented chuck reduces the effects of thermal stresses upon the unexposed portions of the wafer.

While specific embodiments have been described herein for purposes of illustration, various modifications may be made without departing from the spirit and scope of the invention. For example, the steps of the invention can be performed in a different order and still achieve desirable results. Moreover, even though a segmented chuck having four segments is illustrated, a chuck with greater or fewer segments could also be used, and the segmentation could be in two dimensions instead of one dimension. A greater number of segments in the chuck would release the thermal stresses more quickly and completely, while fewer segments in a chuck would increase the thermal stresses somewhat but could result in simpler designs with lower system costs. Further, while this invention is described in the context of an electron beam projection lithography system using an electrostatic segmented chuck, it could be applied to other lithography systems as well. For example, optical lithography systems could use a segmented vacuum chuck configured to operate in accordance with the present invention. Also, the energy source used to expose the wafer may include various types of electromagnetic radiation including: visible light, invisible light, ultraviolet (UV), deep ultra violet (deep UV), and extreme ultraviolet (EUV). Various semiconductor fabrication processes may also be used including: lithography, metal deposition, insular deposition, ion implantation, plasma etching, thermal annealing, chemical mechanical polishing, wafer inspection, wafer testing, and metrology. Accordingly, the invention is not limited to the above-described implementations, but instead is defined by the appended claims in light of their full scope of equivalents.

What is claimed is:

1. A method of reducing the movement of a semiconductor wafer on a segmented chuck during wafer fabrication, comprising:

exposing a region of the semiconductor wafer clamped to a corresponding segment of the chuck to an energy source causing thermal stresses in the exposed region of the semiconductor wafer during the fabrication process;

unclamping the exposed region of the semiconductor wafer from the corresponding segment of the chuck to relieve thermal stress; and reclamping the exposed region of the semiconductor wafer to the corresponding segment of the chuck as the thermal stresses are relieved.

2. The method of claim 1 further comprising, advancing to an unexposed region of the semiconductor wafer clamped to a second segment of the chuck to continue the fabrication process.

3. The method of claim 1 wherein the energy source is electromagnetic radiation used during optical lithography.

4. The method of claim 1 wherein the energy source is an electron beam used with charged particle beam based lithography.

5. The method of claim 1 wherein the segmented chuck uses a vacuum force to clamp the semiconductor wafer.

6. The method of claim 1 wherein the segmented chuck uses electrostatic forces to clamp of the semiconductor wafer.

7. The method of claim 1 wherein each region of the semiconductor wafer includes at least one die or chip site.

8. The method of claim 1 wherein the unclamping is performed on only one region of the semiconductor wafer.

9. The method of claim 1 wherein the unclamping is performed on more than one region but less than all regions of the semiconductor wafer.

10. The method of claim 1 wherein the unclamping and clamping of the regions occurs in a sequence on adjacent regions of the semiconductor wafer.

11. The method of claim 10 wherein the sequence corresponds to a serpentine pattern used during the fabrication process to expose the semiconductor wafer to the energy source.

12. The method of claim 1 wherein the unclamping occurs when the semiconductor wafer is transported at a constant velocity.

13. The method of claim 1 wherein the unclamping occurs when the semiconductor wafer is not moving relative to the energy source.

14. The method of claim 1 wherein the unclamping of the exposed region occurs when other regions of the semiconductor wafer are clamped to other segments of the chuck.

15. A method of reducing the movement of a semiconductor wafer during fabrication using a charged particle energy source, comprising:

exposing a region of the semiconductor wafer clamped to a corresponding segment of the chuck to the charged particle energy source during fabrication causing thermal stresses in the clamped region of the semiconductor wafer;

unclamping the exposed region of the semiconductor wafer from the corresponding segment of the chuck to relieve the thermal stresses; and reclamping the exposed region of the semiconductor wafer to the corresponding segment of the chuck as the thermal stresses are relieved.

16. The method of claim 15 further comprising,
advancing to an unexposed region of the semiconductor wafer clamped to a second segment of the segmented chuck to continue the fabrication process.

17. The method of claim 15 wherein the unclamping is performed on only one segment of the chuck.

18. The method of claim 15 wherein the unclamping is performed on more than one segment but less than all segments of the chuck.

19. The method of claim 15 further comprising the repetition of the unclamping and reclamping sequence on adjacent segments on the chuck.

20. The method of claim 15 wherein the sequence is performed from segment to segment on the semiconductor wafer in a serpentine pattern.

21. The method of claim 15 wherein the unclamping occurs when the semiconductor wafer is transported at a constant velocity.

22. The method of claim 15 wherein the unclamping occurs when the semiconductor wafer is not moving relative to the charged particle energy source.

23. The method of claim 15 wherein the unclamping of the exposed region occurs when other regions of the semiconductor wafer are clamped to other segments of the chuck.

24. A method of reducing the movement of a semiconductor wafer during a lithographic process, comprising:

clamping the semiconductor wafer to the segments of a segmented chuck wherein the segmented chuck is capable of selectively clamping and unclamping said segments to the semiconductor wafer;

exposing a region of the wafer overlying a clamped segment of the chuck to an energy source during the lithographic process that causes thermal stresses in the clamped segment of the semiconductor wafer;

unclamping the exposed region of the semiconductor wafer from the corresponding segment of the chuck to relieve thermal stress; and reclamping the exposed region of the semiconductor wafer to the corresponding segment of the chuck as the thermal stresses are relieved.

25. The method of claim 24 wherein the unclamping of the exposed segment reduces the thermal stresses and corresponding mechanical forces transferred from the exposed segment to the remaining clamped segments in the semiconductor wafer.

26. The method of claim 24 further comprising,
advancing to an unexposed and clamped segment of the semiconductor wafer to continue the lithographic process.

27. The method of claim 24 further comprising,
advancing to an unexposed and clamped segment of the semiconductor wafer to continue the lithographic process.

28. The method of claim 24 wherein the energy source is a light beam used during optical lithography.

29. The method of claim 24 wherein the energy source is an electron beam used during charged particle lithography.

30. The method of claim 24 wherein the segmented chuck uses a vacuum force to clamp a segment of the semiconductor wafer.

31. The method of claim 24 wherein the segmented chuck uses electrostatic forces to clamp a segment of the semiconductor wafer.

32. The method of claim 24 wherein each segment of the semiconductor wafer includes at least one die or chip site.

33. The method of claim 24 wherein the unclamping is performed on only one segment of the semiconductor wafer during a time interval.

34. The method of claim 24 wherein the unclamping is performed on more than one region but less than all regions of the semiconductor wafer during a time interval.

35. The method of claim 24 wherein the unclamping and clamping of the regions occurs in a sequence on adjacent segments of the semiconductor wafer.

36. The method of claim 24 wherein the sequence corresponds to a serpentine pattern used during the lithographic process to expose the semiconductor wafer to the energy source.

37. The method of claim 24 wherein the unclamping occurs when the semiconductor wafer is transported at a constant velocity.

38. The method of claim 24 wherein the unclamping occurs when the semiconductor wafer is not moving relative to the lithography tool.

39. The method of claim 24 wherein the unclamping of the exposed region occurs when the wafer is transported to a location where exposure can begin on dies overlying another segment of the chuck.

* * * * *